United States Patent

Lundsager

[15] 3,660,088

[45] May 2, 1972

[54] PHOTO-RESIST PROCESS

[72] Inventor: Christian B. Lundsager, Ashton, Md.

[73] Assignee: W. R. Grace & Co.

[22] Filed: Sept. 16, 1970

[21] Appl. No.: 72,776

[52] U.S. Cl. ....................................... 96/36, 96/28, 96/36.2, 96/36.3, 96/36.4

[51] Int. Cl. .................... G03c 5/00, G03f 7/00, G03c 11/12

[58] Field of Search ................ 96/36, 35.1, 28, 115 P, 115 R

[56] References Cited

UNITED STATES PATENTS

| | | | |
|---|---|---|---|
| 3,055,758 | 9/1962 | McDonald | 96/35.1 X |
| 3,202,508 | 8/1965 | Heiart | 96/11.5 P X |
| 3,353,955 | 11/1967 | Colgrove | 96/35.1 X |
| 3,408,191 | 10/1968 | Jeffers | 96/28 |
| 3,537,853 | 11/1970 | Wessells et al | 96/35.1 |

*Primary Examiner*—David Klein
*Attorney*—Richard P. Plunkett and Kenneth E. Prince

[57] ABSTRACT

This invention relates to etching metal by a photo-resist process which comprises coating a metal or metal clad, e.g., copper, substrate with a photocurable composition consisting essentially of (1) a polyene containing at least 2 reactive unsaturated carbon to carbon bonds per molecule, (2) a polythiol containing at least two thiol groups per molecule, the total combined functionality of (a) the reactive unsaturated carbon to carbon bonds per molecule in the polyene and (b) the thiol groups per molecule in the polythiol being greater than 4, and (3) 0.0005 to 50 percent by weight of said composition of a photosensitizer, covering said composition with a UV transparent film adherable to the composition in its cured state, exposing said composition through said film and an image bearing transparency or mask to a free radical generator such as electromagnetic radiation having a wave-length of about 2,000–7,000 A. or high energy ionizing radiation to selectively cure and insolubilize the exposed portion of the composition and adhere same to the UV transparent film, removing the image bearing transparency and the UV transparent film with substantially all the cured portion of the composition adhering thereto, thus baring the metal beneath the removed cured portion of the composition, exposing the composition remaining on the metal or the metal clad substrate directly to a free radical generator to cure and insolubilize same, removing the exposed metal from the substrate and thereafter removing the cured composition thus leaving defined metal segments on the substrate.

6 Claims, 7 Drawing Figures

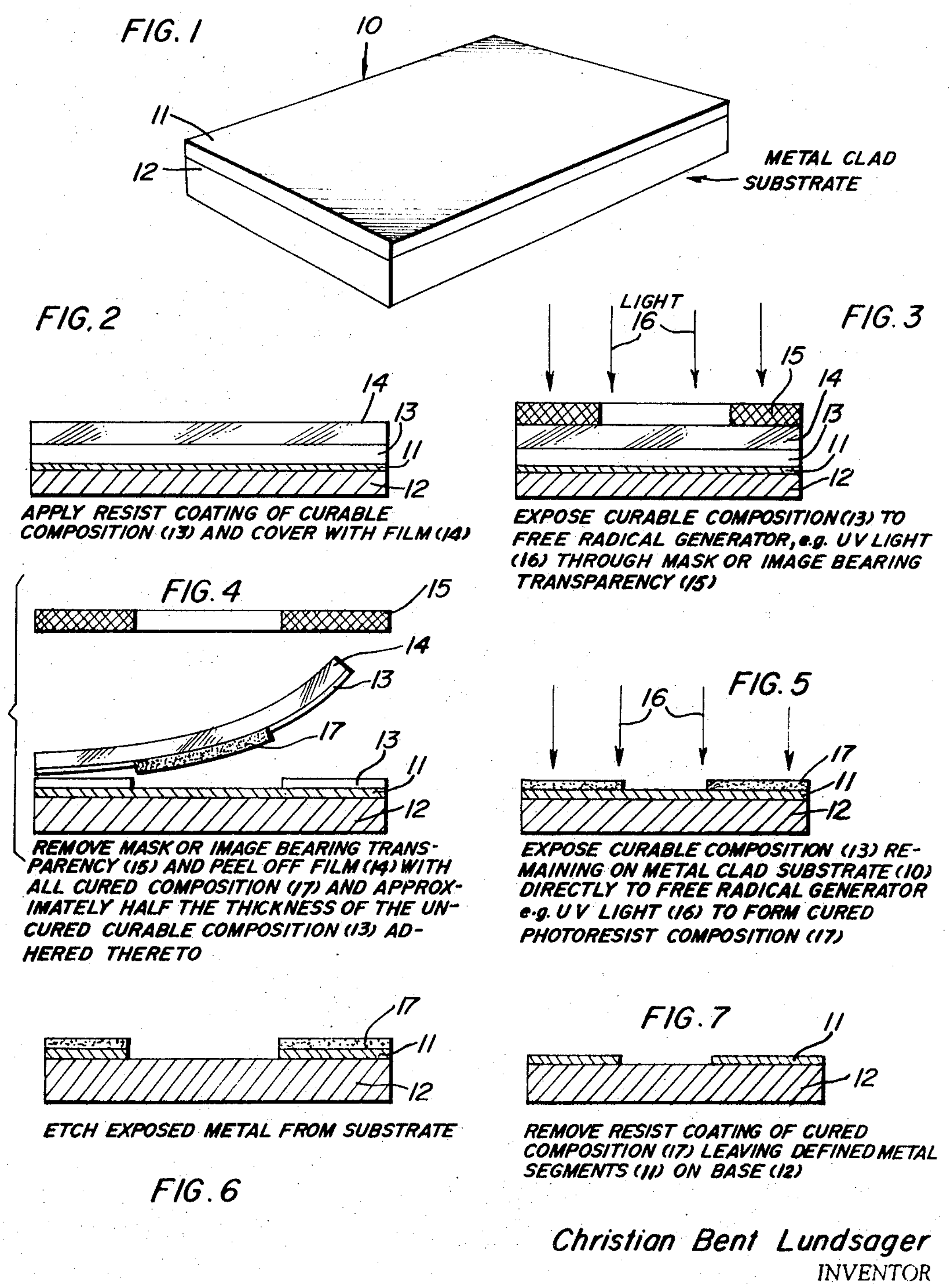

FIG. 1, FIG. 2, FIG. 3, FIG. 4, FIG. 5, FIG. 6, FIG. 7

APPLY RESIST COATING OF CURABLE COMPOSITION (13) AND COVER WITH FILM (14)

EXPOSE CURABLE COMPOSITION (13) TO FREE RADICAL GENERATOR, e.g. UV LIGHT (16) THROUGH MASK OR IMAGE BEARING TRANSPARENCY (15)

REMOVE MASK OR IMAGE BEARING TRANSPARENCY (15) AND PEEL OFF FILM (14) WITH ALL CURED COMPOSITION (17) AND APPROXIMATELY HALF THE THICKNESS OF THE UNCURED CURABLE COMPOSITION (13) ADHERED THERETO

EXPOSE CURABLE COMPOSITION (13) REMAINING ON METAL CLAD SUBSTRATE (10) DIRECTLY TO FREE RADICAL GENERATOR e.g. UV LIGHT (16) TO FORM CURED PHOTORESIST COMPOSITION (17)

ETCH EXPOSED METAL FROM SUBSTRATE

REMOVE RESIST COATING OF CURED COMPOSITION (17) LEAVING DEFINED METAL SEGMENTS (11) ON BASE (12)

Christian Bent Lundsager
INVENTOR

BY Richard P. Plunkett
ATTORNEY

PHOTO-RESIST PROCESS

Photoresists are light sensitive materials which can be used to selectively delineate images onto solid substrates such as metals, wood, ceramics, glass, plastics, resins, fabrics, leather, synthetic or natural rubbers, etc. In the general case, a very thin coating of the resist composition is coated onto the substrate, exposed image-wise either directly using a "point" radiation source or through a stencil or a photographic negative or positive to electromagnetic radiation, for example, UV light. After the image-wise exposure, the uncured or unpolymerized resist in the non-image areas is removed thereby exposing the solid substrate in selected areas. Thereafter the substrate may be etched using materials which are solvents for the substrate but non-solvents for the photocured or photopolymerized resist. In the case of metals, aqueous acids or bases are usual suitable etchants. In the case of plastics, organic solvents are usually preferred.

The attributes of a good photoresist composition are (1) that it adheres to the substrate firmly and readily on photocuring or photopolymerization or both, (2) is unaffected by the etchant for the substrate and (3) is easily removed by a solvent which does not effect the protected area.

One object of the instant invention is to produce a photoresist material which adheres to the substrate readily and firmly on photocuring. Another object of the instant invention is to produce a photoresist that is unaffected by the etchant for the substrate. Yet another object is to produce a photocurable photoresist that is easily removed after curing by a solvent which does not affect the protected area. These and other objects will become apparent from a reading hereinafter.

Summarily this invention relates to etching metal by a photoresist process which comprises coating a metal or a metal clad, e.g., copper, substrate with a photocurable composition consisting essentially of (1) a polyene containing at least two reactive unsaturated carbon to carbon bonds per molecule, (2) a polythiol containing at least two thiol groups per molecule, the total combined functionality of (a) the reactive unsaturated carbon to carbon bonds per molecule in the polyene and (b) the thiol groups per molecule in the polyethiol being greater than four, and (3) 0.0005 to 50 percent by weight of said composition of a photosensitizer, covering said composition with a UV transparent film adherable to the composition in its cured state, exposing said composition through said film and an image bearing transparency or mask to a free radical generator such as electromagnetic radiation having a wavelength of about 2,000–7,000 A. or high energy ionizing radiation to selectively cure and insolubilize the exposed portion of the composition and adhere same to the UV transparent film, removing the image bearing transparency and the UV transparent film with substantially all the cured portion of the composition adhering thereto, thus baring the metal beneath the removed cured portion of the composition, exposing the composition remaining on the metal or the metal clad substrate directly to a free radical generator to cure and insolubilize same, removing the exposed metal from the substrate and thereafter removing the cured composition thus leaving defined metal segments on the substrate.

The present invention is best understood by reference to the following description taken in connection with the accompanying drawings, in which:

FIG. I is an isometric view of a laminated metal clad board or substrate.

FIGS. II–VII are sectional view taken through the board of FIG. I and showing successive steps in the use of the photocurable resist composition according to the present invention.

Turning to the drawings, which illustrate the use of the described photocurable resist composition for making printed circuit boards and the like, FIG. I shows a board or substrate 10 made up of a covering layer 11 of about 0.0014 inch thick copper sheet laminated to a 0.060 inch thick plastic or other electrically insulating substrate 12 such as is commonly used in the printed circuit industry. Substrate 10 is usually scrubbed with an abrasive cleaner and dried prior to lamination and coating.

FIG. II is a sectional view showing substrate 10 after the described photocurable resist composition is applied as by flowing onto the surface of the copper sheet 11 to form layer 13. The excess photocurable resist can be drained by holding the board vertically or by passing a draw bar over the board to maintain a uniformly thick coating. Thereafter, a UV transparent thin film 14 is used to cover curable resist composition 13 and the composition is then ready for exposure. Alternately the resist can be coated onto the UV transparent film which in turn is laminated to the metal clad substrate.

FIG. III shows a mask or image bearing transparency 15, which can be a photographic positive of an electrical circuit, that is placed in contact with the film covering the photocurable resist composition. It should also be noted that instead of a mask or image bearing transparency in contact with the film, it is possible to project an image onto the film through which the curable resist composition can be exposed to a free radical generator source. The curable resist composition is then exposed for a period ranging from about 2 seconds to about 5 minutes or more to a free radical generator source such as electro-magnetic radiation, e.g., UV light represented by arrows 16. Radiation of wavelength from 2,000–7,000 A. units is sufficient to cure and solidify the exposed photoresist material. After exposure, the image bearing transparency is removed and the UV transparent film is stripped off with all the exposed cured photoresist composition 17 and approximately half the thickness of the uncurable composition 13 adhering thereto. The adhesion of the cured photoresist composition to the substrate metal is less than the cohesive strength of the cured photoresist composition and less than the adhesive strength of the cured photoresist composition to the UV transparent film. For this reason the cured photoresist composition readily adheres to the stripped off transparent film.

In FIG. V the remaining curable composition on the metal clad substrate is exposed directly to a free radical generator, e.g., UV light, 16 to form a cured solid photoresist composition over the previously unexposed portions of copper sheet 11. Exposure times and radiation of approximately the same wavelength as used in the steps set out in FIG. III is used to cure the remaining composition to form a photoresist. The substrate at this stage is ready for etching, it has on the copper surface the image of the electrical circuit, said image being comprised of a film of dry, hard photocured resist. The surface area other than that covered by the resist image is bare copper.

After exposure, the photoresist coated substrate is placed in an etchant for the copper sheet to remove the exposed portion of the metal as shown in FIG. VI. Such etchants are well known to those skilled in the art, e.g., for example, copper is removed by a suitable acid-type etchant, e.g., a ferric chloride solution. The substrate can be placed in a spray type etchant machine of a kind commonly used in the industry, which sprays a solution of ferric chloride on the surface. The concentration of the ferric chloride, commonly stated in terms of specific gravity can be 38° Baume. Within several minutes the bare, unprotected copper on the substrate surface will be completely etched away. The substrate is then removed and thoroughly rinsed to remove all traces of ferric chloride and then dried.

FIG. VII shows the substrate after it is immersed in a solvent, e.g., chloroform, toluene, etc. to remove the photocured resist composition, revealing the bright copper electrical surface. The finish copper board can be rinsed in hot water and dried. The steps to remove the photoresist is optional as it may be desirous to leave the photocurable resist material in place as a protective coating for the electrical circuit.

The crucial ingredients in the preferred photocurable composition to form photoresist are:

1. about 2 to about 98 parts by weight of a polyene (or polyyne) containing two or more reactive unsaturated carbon to carbon bonds per molecule;

2. about 98 to about 2 parts by weight of a polythiol; containing at least two thiol groups per molecule; and 3. about 0.0005 to about 50 parts by weight (based on 100 parts by weight of (1) and (2) of a photocuring rate accelerator.

It is to be understood, however, that when energy sources other than visible or ultraviolet light are used to initiate the curing reaction, photocuring rate accelerators (i.e., photosensitizers, etc.) generally are not required in the formulation. That is to say, the actual composition of the photocuring rate accelerator, if required, may vary with the type of energy source that is used to initiate the curing reaction.

The reactive carbon-to-carbon bonds of the polyenes are preferably located terminally, near terminally, and/or pendant from the main chain. The polythiols, preferably, contain two or more thiol groups per molecule. The photocurable compositions are liquid (i.e., flowable) over the temperature range provided during the application.

Methods of preparing various polyenes, with the limitations set forth herein, useful within the scope of this invention are disclosed in copending application Ser. No. 674,773, filed Oct. 12, 1967 and assigned to the same assignee. Some of the useful polyenes are prepared in the detailed examples set forth in the following specification. The general formulas for several, useful, representative polyenes and polyynes are given in the Figure in Dutch (Holland) application No. 67/10439 which was laid open to public inspection and copying thereof on Jan. 29, 1968 (said pertinent portions of said public document being incorporated herein by reference).

The polythiols and one group of operable polyenes which can be cured rapidly as a photoresist by the practice of the instant invention are set out in a copending application assigned to the same assignee having Ser. No. 617,801 filed Feb. 23, 1967 and are incorporated herein by reference. That is, one group of polyenes operable in the instant invention are those having a molecular weight in the range 50 to 20,000, a viscosity ranging from 0 to 20 million centipoises at 70° C of the general formula: $[A]-(X)_m$
wherein X is a member of the group consisting of $$R-\underset{R}{C}=\underset{R}{C}- \text{ and } R-C\equiv C-$$

$m$ is at least 2; R is independently selected from the group consisting of hydrogen, halogen, aryl, substituted aryl, cycloalkyl, aralkyl, substituted arylkyl and alkyl and substituted alkyl groups containing one to 16 carbon atoms and A is a polyvalent organic moiety free of (1) reactive carbon to carbon unsaturated and (2) unsaturated groups in conjunction with the reactive ene or yne groups in X. Thus A may contain cyclic groupings and minor amounts of hetero atoms such as N, S, P, or O but contains primarily carbon-carbon, carbon-oxygen, or silicon-oxygen containing chain linkages without any reactive carbon to carbon unsaturation.

Examples of said operable polyenes include, but are not limited to 1. crotyl-terminated polyurethanes which contain two "reactive" double bonds per average molecule in the near terminal position of the average general formula:

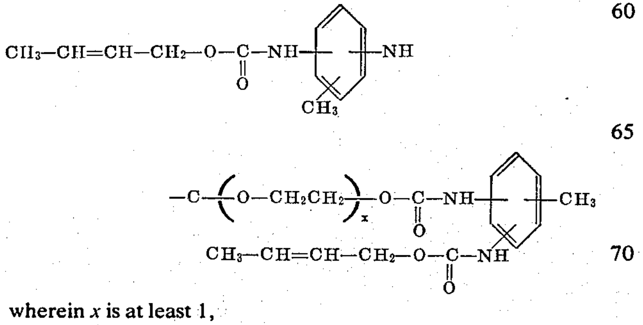

wherein $x$ is at least 1, 2. ethylene/propylene/non-conjugated diene terpolymers, such as "Nordel 1040" manufactured by duPont which contains pendant "reactive" double bonds of the formula: $-CH_2-CH=CH-CH_3$, 3. the following structure which contains terminal "reactive" double bonds:

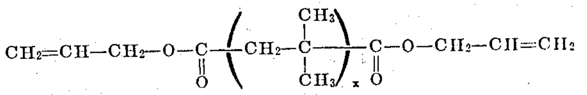

where $x$ is at least 1, 4. the following structure which contains near terminal "reactive" double bonds $$CH_3(CH_2)_7-CH=CH-(CH_2)_7-\underset{\underset{O}{\|}}{C}-(OC_3H_6)_x-O-\underset{\underset{O}{\|}}{C}-(CH_2)_7-CH=CH-(CH_2)_7CH_3$$

where $x$ is at least 1.

As used herein polyenes and polyynes refer to simple or complex species of alkenes or alkynes having a multiplicity of pendant, terminally positioned "reactive" carbon to carbon unsaturated functional groups per average molecule. For example, a diene is a polyene that has two "reactive" carbon to carbon double bonds per average molecule, while a diyne is a polyyne that contains in its structure two "reactive" carbon to carbon triple bonds per average molecule. Combinations of "reactive" double bonds and "reactive" triple bonds within the same molecule are also possible. An example of this is monovinylacetylene, which is a polyeneyne under our definition. For purposes of brevity all these classes of compounds will be referred to hereafter as polyenes.

A second group of polyenes operable in the instant invention includes unsaturated polymers in which the double or triple bonds occur primarily within the main chain of the molecules. Examples include conventional elastomers (derived primarily from standard diene monomers) such as polyisoprene, polybutadiene, styrene-butadiene rubber, isobutylene-isoprene rubber, polychloroprene, styrene-butadiene-acrylonitrile rubber, and the like; unsaturated polyesters, polyamides, and polyurethanes derived from monomers containing "reactive" unsaturation, e.g., adipic acid-butenediol, 1,6-hexanediaminefumaric acid and 2,4-tolylene diisocyanate-butenediol condensation polymers and the like.

A third group of polyenes operable as part of the adhesive composition in this invention includes those polyenes in which the reactive unsaturated carbon to carbon bonds are conjugated with adjacent unsaturated groupings. Examples of operable reactive conjugated ene systems include, but are not limited to the following:

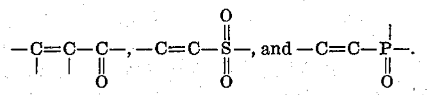

A few typical examples of polymeric polyenes which contain conjugated reactive double bond groupings such as those described above are polyethyleneether glycol diacrylate having a molecular weight of about 750, polytetramethyleneether glycol dimethacrylate having a molecular weight of about 1,175, the triacrylate of the reaction product of trimethylolpropane with 20 moles of ethylene oxide, and the like.

Another group of polyenes operable as part of the adhesive compositions having an -ene or -yne functionality of at least two are formed by reacting either a. An organic epoxide containing at least two

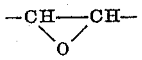

groups in its structure with a member of the group consisting of hydrazine, primary amines, secondary amines, tertiary amine salts, organic alcohols and organic acids wherein said group members contain at least one organic substituent containing a reactive ethylenically or ethynylically unsaturated group, or b. An organic epoxide containing at least one organic substituent containing a reactive ethylenically or ethynylically unsaturated group with a member of the group consisting active hydrogen functions from the group consisting of —N(H)—, —N⁺(—)—H, —OH, —SH, >B—H and >P—H.

As used herein for determining the position of the reactive functional carbon to carbon unsaturation, the term "terminal" means that said functional unsaturation is at an end of the main chain in the molecule; whereas by "near terminal" is meant that the functional unsaturation is not more than 16 carbon atoms away from an end of the main chain in the molecule. The term "pendant" means that the reactive carbon to carbon unsaturation is located terminally or near terminally in a branch of the main chain as contrasted to a position at or near the ends of the main chain. For purposes of brevity all of these positions will be referred to generally as "terminal" unsaturation.

The liquid polyenes operable in the first group of polyenes described above in the instant invention contain one or more of the following types of non-aromatic and non-conjugated "reactive" carbon to carbon unsaturation:

| | |
|---|---|
| (1) —CH=CH— | (5) >C=C< |
| (2) —CH≡C— | (6) >C=CH— |
| (3) —CH=CH₂ | (7) —CH=C< |
| (4) —C≡CH | (8) >C=CH₂ |

These functional groups as shown in 1–8 supra are situated in a position either which is pendant, terminal or near terminal with respect to the main chain but are free of terminal conjugation. As used herein the phrase "free of terminal conjugation" means that the terminal "reactive" unsaturated groupings may not be linked directly to non-reactive unsaturated species such as:

$$-\overset{O}{\overset{\|}{C}}-,\ -\underset{\underset{O}{\|}}{\overset{\overset{O}{\|}}{S}}-,\ -\underset{|}{\overset{\overset{O}{\|}}{P}}-$$

and the like so as to form a conjugated system of unsaturated bonds exemplified by the following structure:

$$R-\underset{R}{\underset{|}{C}}=\underset{R}{\underset{|}{C}}-\underset{O}{\underset{\|}{C}}-,$$

etc.

On the average, the polyenes must contain two or more "reactive" unsaturated carbon to carbon bonds/molecule and have a viscosity in the range from 0 to 20 million centipoises at 70° C. Included in the term "polyenes" as used herein are those materials which in the presence of an inert solvent, aqueous dispersion or plasticizer fall within the viscosity range set out above at 70° C. Operable polyenes in the instant invention have molecular weights in the range 50–20,000, preferably 500 to 10,000.

As used herein the term "reactive" unsaturated carbon to carbon groups means groups having the structures as shown in 1–8 supra which will react under proper conditions as set forth herein with thiol groups to yield the thioether linkage $$(-\overset{|}{\underset{|}{C}}-S-\overset{|}{\underset{|}{C}}-),$$

as contrasted to the term "unreactive" carbon to carbon unsaturation which means $$-\overset{|}{C}=\overset{|}{C}-$$

groups when found in aromatic nucleii (cyclic structures exemplified by benzene, pyridine, anthracene, and the like) which do not under the same conditions react with thiols to give thioether linkages. In the instant invention, photoresist products from the reaction of polyenes with polythiols which contain two or more thiol groups per average molecule are called polythioether polymers or polythioethers.

As used herein, the term polythiols refers to simple or complex organic compounds having a multiplicity of pendant or terminally positioned —SH functional groups per average molecule.

On the average the polythiols must contain two or more —SH groups/molecule. They usually have a viscosity range of 0 to 20 million centipoises (cps) at 70° C as measured by a Brookfield Viscometer. Included in the term "polythiols" as used herein are those materials which in the presence of an inert solvent, aqueous dispersion or plasticizer fall within the viscosity range set out above at 70° C. Operable polythiols in the instant invention usually have molecular weights in the range 50–20,000, preferably 100–10,000.

The polythiols operable in the instant invention can be exemplified by the general formula: $R_8\text{—}(SH)_n$ where $n$ is at least 2 and $R_8$ is a polyvalent organic moiety free from reactive carbon to carbon unsaturation. Thus $R_8$ may contain cyclic groupings and minor amounts of hetero atoms such as N, S, P, or O but primarily contains carbon-hydrogen, carbon-oxygen, or silicon-oxygen containing chain linkages free of any reactive carbon to carbon unsaturation.

One class of polythiols operable with polyenes in the instant invention to obtain a polythioether adhesive are esters of thiol-containing acids of the general formula: $HS\text{—}R_9\text{—}COOH$ where $R_9$ is an organic moiety containing no "reactive" carbon to carbon unsaturation with polyhydroxy compounds of the general structure: $R_{10}\text{—}(OH)_n$ where $R_{10}$ is an organic moiety containing no "reactive" carbon to carbon unsaturation and $n$ is 2 or greater. These components will react under suitable conditions to give a polythiol having the general structure:

$$R_{10}\text{—}\left(O\underset{O}{\underset{\|}{C}}\text{—}R_9\text{—}SH\right)_n$$

where $R_9$ and $R_{10}$ are organic moieties containing no "reactive" carbon to carbon unsaturation and $n$ is 2 or greater.

Certain polythiols such as the aliphatic monomeric polythiols (ethane dithiol, hexamethylene dithiol, decamethylene dithiol, tolylene-2,4-dithiol, etc. and some polymeric polythiols such as a thiol-terminated ethylcyclohexyl dimercaptan polymer, etc. and similar polythiols which are conveniently and ordinarily synthesized on a commercial basis, although having obnoxious odors, are operable in this invention but many of the end products are not widely accepted from a practical, commercial point of view. Examples of the polythiol compounds preferred for this invention because of their relatively low odor level include, but are not limited to, esters of thioglycolic acid ($HS\text{—}CH_2COOH$), β-mercaptopropionic acid ($HS\text{—}CH(CH_3)\text{—}COOH$) and β-mercaptopropionic acid ($HS\text{—}CH_2CH_2COOH$) with polyhydroxy compounds such as glycols, triols, tetraols, pentaols, hexaols, etc. Specific examples of the preferred polythiols include, but are not limited to, ethylene glycol bis (thioglycolate), ethylene glycol bis (β-mercaptopropionate), trimethylolpropane tris (thioglycolate), trimethylolpropane tris (β-mercaptopropionate), pentaerythritol tetrakis (thioglycolate), tris (hydroxyethyl) isocyanurate tris (β-mercaptopropionate) and pentaerythritol tetrakis (β-mercaptopropionate), most of which are commercially available. A specific example of a preferred polymeric polythiol is polypropylene ether glycol bis (β-mercaptopropionate) which is prepared from polypropylene ether glycol (e.g., Pluracol P2010, Wyandotte Chemical Corp.) and β-mercaptopropionic acid by esterification.

The preferred polythiol compounds are characterized by a low level of mercaptan-like odor initially, and after reaction, give essentially odorless polythioether end products which are commercially attractive.

The term "functionality" as used herein refers to the average number of ene or thiol groups per molecule in the polyene or polythiol, respectively. For example, a triene is a polyene with an average of three "reactive" carbon to carbon unsaturated groups per molecule and thus has a functionality ($f$) of 3. A dithiol is a polythiol with an average of two thiol groups per molecule and thus has a functionality ($f$) of 2.

It is further understood and implied in the above definitions that in these systems, the functionality of the polyene and the polythiol component is commonly expressed in whole numbers although in practice the actual functionality may be fractional. For example, a polyene component having a nominal functionality of 2 (from theoretical considerations alone) may in fact have an effective functionality of somewhat less than 2. In an attempted synthesis of a diene from a glycol in which the reaction proceeds to 100 percent of the theoretical value for complete reaction, the functionality (assuming 100 percent pure starting materials) would be 2.0. If however, the reaction were carried to only 90 percent of theory for complete reaction, about 10 percent of the molecules present would have only one ene functional group, and there may be a trace of materials that would have no ene functional groups at all. Approximately 90 percent of the molecules, however, would have the desired diene structure and the product as a whole would then have an actual functionality of 1.9. Such a product is useful as an adhesive in the instant invention and is referred to herein as having a functionality of 2.

The aforesaid polyenes and polythiols, can if desired, be formed or generated in situ and still be rapidly cured by the process of the instant invention.

To obtain the maximum strength, solvent resistance, creep resistance, heat resistance and freedom from tackiness, the reactive components consisting of the polyenes and polythiols in combination with a curing rate accelerator of this invention are formulated in such a manner as to give solid, crosslinked, three dimensional network polythioether polymer systems on curing. In order to achieve such infinite network formation the individual polyenes and polythiols must each have a functionality of at least 2 and the sum of the functionalities of the polyene and polythiol components must always be greater than 4. Blends and mixtures of the polyenes and the polythiols containing such functionality are also operable herein.

The photoresist compositions to be cured, i.e., (converted to solid resins or elastomers) in accord with the present invention may, if desired, include such additives as antioxidants, accelerators, dyes, inhibitors, activators, fillers, pigments, antistatic agents, flame-retardant agents, thickeners, thixotropic agents, surface-active agents, viscosity modifiers, extending oils, plasticizers, tackifiers and the like within the scope of this invention. Such additives are usually preblended with the polyene or polythiol prior to or during the compounding step. Operable fillers include natural and synthetic resins, carbon black, glass fibers, wood flour, clay, silica, alumina, carbonates, oxides, hydroxides, silicates, glass flakes, glass beads, borates, phosphates, diatomaceous earth, talc, kaolin, barium sulfate, calcium sulfate, calcium carbonate, antimony oxide and the like. The aforesaid additives may be present in quantities up to 500 parts or more parts of the polyene-polythiol photoresist compositions by weight and preferably 0.005–300 parts on the same basis.

In all the curable photoresist systems herein, the compositions consist of 2 to 98 parts by weight of a polyene containing at least two reactive unsaturated carbon to carbon bonds per molecule and 98 to 2 parts by weight of a polythiol containing at least two thiol groups per molecule. If a photocuring rate accelerator is used, it is present in an amount ranging from 0.0005 to 50 parts by weight of the polyene-polythiol photoresist composition.

Although the preferred means of curing is by means of electromagnetic radiation of wavelength of about 2,000–4,000 A. (because of simplicity, economy and convenience), the polyene-polythiol photoresist composition of the instant invention can be cured also by imagewise directed beams of ionizing irradiation. A preferred feature of the ionizing irradiation operation of the instant invention is treatment with high energy particle irradiation or by gamma rays or X-rays. Irradiation employing particles in the instant invention includes the use of positive ions (e.g., protons alpha particles and deuterons, electrons or neutrons). The charged particles may be accelerated to high speeds by means of various voltage gradient mechanisms such as a Van de Graaff generator, a cyclotron, a Cockroft Walton accelerator, a resonant cavity accelerator, a betatron, a G.E. resonant transformer, a synchrotron or the like. Furthermore, particle irradiation may also be supplied from cathode ray tubes, radioactive isotopes or an atomic pile. Gamma rays or X-rays may be obtained from radio iostopes (e.g., cobalt 60) or by particle bombardment or suitable target).

The dose rate for the irradiation operable to cure the photoresist composition in the instant invention is in the range 0.0001 to 25 megarads/second.

The amount of ionizing radiation which is employed in curing the photocurable photoresist composition in the instant invention can vary between broad limits. Radiation dosages of less than a megarad up to 10 megarads or more for electrons are operable, preferably 0.02 to 5 megarads energy absorbed are employed. For gamma rays or X-rays, radiation dosages in the range 0.0001 to 5.0 megarads energy absorbed are operable. The irradiation step is ordinarily performed under ambient temperature conditions but can be performed at temperature ranging from below room temperature up to temperatures above which the photoresist starts to degrade.

When using ionizing radiation, the depth of penetration is dependent upon the density of the material to be penetrated. When the ionizing irradiation is in the form of electrons, 200–500 kev. electrons may be used with a screen or mask equivalent to 20–100 mils of unit density material. This can then be aluminum of 7–35 mils or copper or stainless steel of 2–15 mils or more or any other metallic, non-metallic or organic sheeting that can be readily fabricated. X-rays are not as suitable for this application but low energy X-rays in the range of 500–20,000 ev. can also be used.

PREPARATION OF POLYENES

EXAMPLE 1

One mole diglycidyl ether of Bisphenol A having a molecular weight in the range 370–384 and commercially available from Shell Chemical Company under the trade name "Epon 828" and 2 moles of diallyl amine were charged to a beaker at room temperature (25° C). The reaction was continued for 18 hours with stirring during which time the exotherm and reaction temperature was maintained below 80° C. The thus formed allyl terminated liquid prepolymer will hereinafter be referred to as Prepolymer A.

EXAMPLE 2

One mole of a commercially available liquid polymeric diisocyanate sold under the trade name "Adiprene L 100" by E. I. DuPont de Nemours & Co., was charged to a resin kettle equipped with a condenser, stirrer, thermometer and a gas inlet and outlet along with 4 grams of dibutyl tin dilaurate as a catalyst. Two moles of allyl alcohol was slowly added to the kettle during which time the exotherm and reaction temperature was maintained below 80° C. After the addition of the allyl alcohol was completed the reaction was continued for 15 hours at 70° C under nitrogen. The thus formed allyl terminated liquid prepolymer will hereinafter be referred to as Prepolymer B.

EXAMPLE 3

One mole of commercially available tolylene diisocyanate was charged to a resin kettle equipped with a condenser, stirrer, thermometer, and gas inlet and outlet. Two moles of the diallyl ether of trimethylpropane was slowly added to the kettle. After the addition was complete, 4.0 grams of dibutyl tin dilaurate as a catalyst was added to the kettle and the reaction was continued for 30 minutes at 70° C under nitrogen. The thus formed allyl terminated liquid prepolymer will hereinafter be referred to as Prepolymer C.

EXAMPLE 4

One mole of commercially available polyethylene glycol having a molecular weight of 1,450 and a specific gravity of 1.21 was charged to a resin kettle maintained under nitrogen and equipped with a condenser, stirrer, thermometer and a gas inlet and outlet. 2.9 g. of dibutyl tin dilaurate as a catalyst was charged to the kettle along with 2 moles tolylene-2,4-diisocyanate and 2 moles of allyl alcohol. The reaction was continued with stirring at 60° C for 2 hours. Thereafter a vacuum of 1 mm. was applied for 2 hours at 60° C to remove the excess alcohol. This $CH_2=CH-$ terminated prepolymer had a molecular weight of approximately 1,950 and will hereinafter be referred to as Prepolymer D.

EXAMPLE 5

2.0 moles of trimethylol propane diallyl ether and 0.2 g. of dibutyl tin dilaurate as a catalyst were charged to a resin kettle maintained under nitrogen and equipped with a stirrer, thermometer, dropping funnel, and a gas inlet and outlet. 1.0 mole of tolylene diisocyanate was added slowly with stirring and the reaction temperature was maintained at 70° C by means of a water bath for the flask. After the addition of the tolylene diisocyanate, the reaction was continued for about 1 hour at 70° C until the NCO content was substantially zero. The thus formed allyl terminated liquid prepolymer will hereinafter be referred to as Prepolymer E.

EXAMPLE 6

To a 1-liter four neck flask heated at 110° C was charged 808 g. of a polyester diol (having a molecular weight 3,232) sold under the trade name "RC Polyester S 101–35" by R. C. Division, Hooker Chemical Corp. and 0.1 cc. dibutyl tin dilaurate. The flask was maintained under vacuum at 110° C for 1 hour. The flask was cooled to approximately 50° C and with nitrogen passing through, a mixture of 10 g. of allyl alcohol and 60 g. of tolylene-2,4-diisocyanate was added via a dropping funnel at a moderate rate. The reaction was allowed to continue for 15 minutes. A maximum temperature of 90° C was produced by the exothermic reaction. The polymeric product obtained was a solid at room temperature but liquid at 70° C. The product had an average molecular weight of approximately 10,500, a viscosity of 270,000 centipoises at 70° C and will be referred to as Prepolymer F.

EXAMPLE 7

One mole of Prepolymer E from Example 5 was admixed with 1 mole of pentaerythritol tetrakis (β-mercaptopropionate) commercially available from Carlisle Chemical Co. under the trade name "Q–43" and 1.8 g. of benzophenone to form a photocurable composition. The admixture was applied uniformly in a layer thickness of 1 mil to the copper surface of a circuit board comprising a 2 mil thick copper cladding on a 2 mil thick film of polyethylene terephthalate commercially available from E. I. DuPont under the trade name "Mylar." The photocurable composition was intimately covered with a commercially available 4 mil thick vinyl-coated polyethylene terephthalate film as a cover sheet. A positive, image-bearing transparency of a printed circuit was placed on top of the cover sheet and the photocurable composition was exposed through the transparency and cover sheet to a 275 watt RS sun lamp for 30 seconds at a surface intensity of 4,000 microwatts/cm$^2$. The major spectral lines of this lamp were all above 3,000 A. Such exposure caused curing and solidification of the photocurable composition in the exposed areas and adhesion of the cured composition to the cover sheet. The positive, image-bearing transparency was removed. The cover sheet was peeled off the substrate and discarded, leaving only approximately half the thickness of unexposed photocurable composition on the copper clad, but removing all the cured photocurable composition, thus baring the copper surface in the exposed areas of the substrate. The remaining uncured, unexposed, photocurable composition on the copper clad substrate was exposed directly to the 275 watt RS sun lamp for 30 seconds at a surface intensity at the composition of 4,000 microwatts/cm$^2$ to cure and solidify the photocurable composition into a photoresist. The thus formed photoresist-coated substrate was then sprayed with a ferric chloride solution (38° Baume) from a spray-type etchant machine until the exposed unprotected copper was removed from the substrate. The substrate was then immersed in chloroform to swell the photocured resist composition, which was readily removed by rubbing with a cloth, revealing the desired copper electrical circuit on the Mylar substrate.

EXAMPLE 8

Example 7 was repeated except that 1 mole of Prepolymer D and one-half mole of "Q–43" was added to the benzophenone to form the photocurable composition. The results were substantially the same.

EXAMPLE 9

Example 7 was repeated except that 1 mole of Prepolymer A and 1.0 mole of "Q–43" were added to the benzophenone to form a photocurable composition. The results were substantially the same.

EXAMPLE 10

Example 7 was repeated except that 1 mole of Prepolymer F and one-half mole of "Q–43" was added to the benzophenone to form a photocurable composition. The results were substantially the same.

EXAMPLE 11

Example 7 was repeated except that 1.5 moles of Prepolymer C and 2.0 moles of tris(hydroxyethyl)isocyanurate tris (β-mercaptopropionate) i.e.,

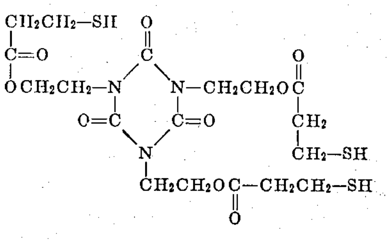

were added to the benzophenone as the photocurable composition. The results were substantially the same.

EXAMPLE 12

Example 7 was repeated except that the photocurable admixture comprised 1.5 moles of Prepolymer A and 2 moles of trimethylolpropane tris (β-mercaptopropionate) and 1.5 grams of dibenzosuberone instead of the 1.5 grams of benzophenone. The results were substantially the same.

EXAMPLE 13

Example 7 was repeated except that 1 mole of Prepolymer B and one-half mole of "Q–43" was added to the benzophenone as the photocurable composition. The results were substantially the same.

EXAMPLE 14

Example 7 was repeated except that 1 mole of Prepolymer C and 1 mole of "Q–43" was added to the benzophenone to form the photocurable composition. The results were substantially the same.

The following examples show chemical milling using the composition and process of the instant invention.

EXAMPLE 15

A layer of 1.0 mil thickness of the photocurable composition from Example 7 was coated uniformly on a 0.006 inch thick sheet of aluminum. A cover sheet of 4 mil thick clear, vinyl-coated, polyethylene terephthalate film was applied intimately over the photocurable layer to make a sandwich construction. The cover sheet of the sandwich was covered with a photographic, line-image, positive transparency and the photocurable composition was exposed through the transparency and cover sheet to a 275 watt RS sun lamp at a surface intensity at the composition of 4,000 microwatts/cm$^2$ for a period of 1 minute. The major spectral lines of the lamp were all above 3,000 A. After removing the positive transparency the cover sheet with all the exposed, cured, photocurable composition and approximately one-half the thickness of the uncured, unexposed, photocurable composition adhering thereto was removed and discarded. The remaining uncured, unexposed, photocurable composition on the aluminum sheet was exposed directly for 30 seconds to a 275 watt RS sun lamp at an intensity of 4,000 microwatts/cm$^2$ at the surface of the photocurable composition to cure and solidify the composition and adhere it to the aluminum sheet as a photoresist. The aluminum sheet was treated on the surface containing the photoresist with a 50/50 mixture of concentrated $HCl/H_2O$ at room temperature. After 2 minutes all the exposed aluminum sheet was etched through its entire thickness by the chemical milling reaction.

EXAMPLE 16

Example 15 was repeated except that the coating, imaging, and development operations were performed in the manner described on both sides of the aluminum sheet so that the two identical images were superimposed on opposite sides. In this instance the chemical milling was accomplished by immersion of the metal sheet in a bath of the etchant solution. The exposed aluminum was etched in 1 minute.

The following example shows the use of the photocurable photoresist composition in photoengraving.

EXAMPLE 17

A conventional zinc plate 65 mils in thickness was wiped with a cloth soaked in a benzene solution of a photocurable photoresist composition consisting essentially of 1 mole of Prepolymer A from Example 1, 1 mole of pentaerythritol tetrakis ($\beta$-mercaptopropionate) and 1.8 g. of dibenzosuberone. The benzene was evaporated off and the composition was intimately covered with a commercially available 4 mil thick vinyl-coated, polyethylene terephthalate film as a cover sheet. A positive, image-bearing transparency was placed on top of the cover sheet and the photocurable composition was exposed through the transparency and cover sheet to a 275 watt RS sun lamp 1 minute at a surface intensity of 4,000 microwatts/cm$^2$ The major spectral lines of this lamp were all above 3,000 A. After removing the positive transparency, the cover sheet with all the exposed, cured, photocurable composition and approximately one-half the thickness of the uncured, unexposed photocurable composition adhering thereto was removed. The remaining uncured, unexposed photocurable composition on the zinc plate was exposed directly for 30 seconds to a 275 watt RS sun lamp at a surface intensity of 4,000 microwatts/cm$^2$ at the surface of the photocurable composition to cure and solidify the composition and adhere it to the zinc plate as a photoresist. The plate was placed in a conventional powderless etching machine wherein it was etched with a nitric acid-containing etchant until a relief depth of 33 mils was obtained. The photoengraving plate, when used in printing on a conventional letter press, gave characters of good quality.

EXAMPLE 18

Example 7 was repeated except that a 15 mil thick stainless steel mask supplied the image and instead of a UV sun lamp being used for both curing steps, the photocurable composition was passed under the beam of a 300 kev. Insulated Core Transformer manufactured by High Voltage Engineering at a pass rate of 18.4 inches per minute. The Transformer was maintained at a beam current of 95 microamperes while the composition was passed under its 12 inch scan window at a distance of 2 inches therefrom. A copper electrical circuit on the Mylar substrate resulted from this procedure.

In chemical milling, metal thicknesses ranging from about 0.0005 to 0.02 inches can be readily etched away with tolerances of $\pm$ 0.0002 to 0.005 depending on the type and thickness of the metal. Even greater metal thicknesses can be etched away, however, a proportional increase in tolerance (usually 0.25 to 0.5 of the overall metal thickness) must be considered. The metals which can be etched by the instant invention are many and varied and include, but are not limited to, aluminum, aluminum alloys, brass, copper, carbon steel, carious stainless steels, tool steel, magnesium, nickel, silver, and the like.

The thickness of the photocurable photoresist layer is dependent upon the photographic resolution desired. That is, for images that require high photographic resolution, e.g., to resolve lines and spaces down to 0.2 mils in width, photoresist layers of about 0.015 mils thick should be used. For less photographic resolution, thicker photoresist layer can be employed. A photocurable photoresist layer thickness in the range 0.015–5.0 mils is operable.

What is claimed is:

1. A process for etching metal comprising the steps of
A. applying to a metal surface a substantially uniformly thick coating of a photocurable composition consisting essentially of
 1. a polyene containing at least two reactive unsaturated carbon to carbon bonds per molecule,
 2. a polythiol containing at least two thiol groups per molecule, the total combined functionality of (a) the reactive unsaturated carbon to carbon bonds per molecule in the polyene and (b) the thiol groups per molecule in the polythiol being greater than 4, and
 3. 0.005 to 50 parts by weight based on 100 parts by weight of (1) and (2) supra of a photocuring rate accelerator
B. intimately covering said composition with a transparent film adherable to said composition when the composition is in its cured state,
C. exposing said composition through said film and an image-bearing transparency to a free radical generator, thereby selectively curing and insolubilizing the exposed portions of said composition,
D. removing said image-bearing transparency,
E. removing the transparent film with substantially all the cured portion and approximately one half of the uncured portion of the photocurable composition adhering thereto, thereby baring the metal beneath the removed cured portion of the composition,
F. exposing the composition remaining on the metal directly to a free radical generator to cure and insolubilize the photocurable composition,
G. etching the exposed metal portions of said metal to the desired depth and
H. optionally removing the remaining portion of said cured composition from said metal.

2. The process according to claim 1 wherein the free radical generator is electromagnetic radiation having a wavelength of about 2,000–7,000 A.

3. A process for etching metal comprising the steps of
A. applying to a metal surface a substantially uniformly thick coating of a photocurable composition consisting essentially of
 1. a polyene containing at least two reactive unsaturated carbon to carbon bonds per molecule,
 2. a polythiol containing at least two thiol groups per molecule, the total combined functionality of (a) the reactive unsaturated carbon to carbon bonds per molecule in the polyene and (b) the thiol groups per molecule in the polythiol being greater than 4, B. intimately covering said composition with a transparent film adherable to said composition when the composition is in the cured state, C. exposing said composition through said film and an image-bearing mask to high energy ionizing irradiation, thereby selectively curing and insolubilizing the exposed portions of said composition, D. removing said image-bearing mask, E. removing the transparent film with substantially all the cured portion and approximately one-half of the uncured portion of the photocurable composition adhering thereto, thereby baring the metal beneath the removed cured portion of the composition, F. exposing the composition remaining on the metal directly to a free radical generator to cure and insolubilize the photocurable composition, G. etching the exposed metal portions of said metal to the desired depth, and H. optionally removing the remaining portion of said cured composition from said metal.

4. The process according to claim 1 wherein the photocurable composition is applied to said transparent film prior to being applied to the metal surface.

5. The process according to claim 3 wherein the photocurable composition is applied to the transparent film prior to being applied to the metal surface.

6. The process according to claim 3 wherein the free radical generator is electromagnetic radiation having a wavelength of about 2,000–7,000 A.

* * * * *